(12) United States Patent  
Sotoku et al.

(10) Patent No.: US 10,639,665 B2  
(45) Date of Patent: May 5, 2020

(54) SUBSTRATE PROCESSING APPARATUS AND STANDBY METHOD FOR EJECTION HEAD

(71) Applicant: SCREEN HOLDINGS CO., LTD., Kyoto (JP)

(72) Inventors: Kota Sotoku, Kyoto (JP); Hiroyuki Yashiki, Kyoto (JP); Masanobu Sato, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/056,387

(22) Filed: Aug. 6, 2018

(65) Prior Publication Data

US 2018/0350592 A1    Dec. 6, 2018

Related U.S. Application Data

(62) Division of application No. 14/213,203, filed on Mar. 14, 2014, now abandoned.

(30) Foreign Application Priority Data

Mar. 15, 2013    (JP) ................................ 2013-052931

(51) Int. Cl.
B05B 15/555    (2018.01)
H01L 21/02    (2006.01)
H01L 21/67    (2006.01)

(52) U.S. Cl.
CPC ...... *B05B 15/555* (2018.02); *H01L 21/02052* (2013.01); *H01L 21/67051* (2013.01)

(58) Field of Classification Search
None
See application file for complete search history.

(56) References Cited

U.S. PATENT DOCUMENTS

2001/0003966 A1    6/2001    Kitano et al.
2003/0059534 A1    3/2003    Nishijima et al.
(Continued)

FOREIGN PATENT DOCUMENTS

CN    1672806 A    9/2005
CN    102057468 A    5/2011
(Continued)

OTHER PUBLICATIONS

English Machine Translation of JP 2002-036574 A.*
(Continued)

*Primary Examiner* — Nicole Blan
(74) *Attorney, Agent, or Firm* — McDermott Will & Emery LLP

(57) ABSTRACT

In a substrate processing apparatus, an ejection surface of an ejection head located at a standby position is immersed in an immersion liquid retained in a reservoir during standby of the ejection head. This prevents drying of a plurality of outlets provided in the ejection head and drying of processing liquid flow passages that communicate with the outlets. It is thus possible to suppress or prevent clogging of the fine outlets. When the ejection head resumes processing on a substrate, the immersion liquid in the reservoir is discharged and then a liquid removing part removes the immersion liquid adhering to the ejection surface. Accordingly, it is possible to prevent the immersion liquid remaining on the ejection surface from dropping and adhering to the substrate (so-called "liquid dripping") when, for example, the ejection head is moved to a position above the substrate.

14 Claims, 6 Drawing Sheets

(56) References Cited

U.S. PATENT DOCUMENTS

| | | |
|---|---|---|
| 2006/0233952 A1 | 10/2006 | Nakashima et al. |
| 2009/0114253 A1 | 5/2009 | Matsumoto |
| 2011/0031326 A1 | 2/2011 | Sato |
| 2013/0020284 A1 | 1/2013 | Osada et al. |

FOREIGN PATENT DOCUMENTS

| | | | |
|---|---|---|---|
| JP | 07-155666 A | | 6/1995 |
| JP | 10-256116 A | | 9/1998 |
| JP | 2001-157863 A | | 6/2001 |
| JP | 2001-232250 A | | 8/2001 |
| JP | 2002-043210 A | | 2/2002 |
| JP | 2002036574 A | * | 2/2002 |
| JP | 2006-302934 A | | 11/2006 |
| JP | 2008-118027 A | | 5/2008 |
| JP | 2011-029315 A | | 2/2011 |
| JP | 2012-043949 A | | 3/2012 |
| JP | 2013-178965 A | | 9/2013 |
| KR | 10-2005-0097380 A | | 10/2005 |
| KR | 10-2013-0011928 A | | 1/2013 |
| WO | 2007/132609 A1 | | 11/2007 |

OTHER PUBLICATIONS

Non-Final Office Action issue in related parent U.S. Appl. No. 14/213,203, dated Jul. 21, 2017.
Final Office Action issue in related parent U.S. Appl. No. 14/213,203, dated Jan. 19, 2018.
Non-Final Office Action issue in related parent U.S. Appl. No. 14/213,203, dated May 10, 2018.

* cited by examiner

SUBSTRATE PROCESSING APPARATUS AND STANDBY METHOD FOR EJECTION HEAD

CROSS-REFERENCE TO RELATED APPLICATIONS

This Application is a Divisional of U.S. patent application Ser. No. 14/213,203, filed on Mar. 14, 2014, which claims priority benefit of Japanese Patent Application No. 2013-052931, filed on Mar. 15, 2013. The entire contents of these applications are incorporated herein by reference in their entirety.

TECHNICAL FIELD

The present invention relates to a substrate processing apparatus for processing a substrate and a standby method for an ejection head of the substrate processing apparatus.

BACKGROUND ART

A process of manufacturing semiconductor substrates (hereinafter, simply referred to as "substrates") conventionally involves various types of processing performed by a substrate processing apparatus on a substrate having an insulation film such as an oxide film. One example is cleaning processing for removing particles or the like that adhere to the surface of a substrate by supplying a cleaning liquid to the substrate surface.

International Publication No. WO 2007/132609 (Document 1) discloses a substrate cleaning apparatus that is provided with a droplet removing nozzle disposed in the vicinity of a process nozzle located at a standby position outside a substrate, and in which gas is blown from the droplet removing nozzle against the process nozzle in order to prevent unintended liquid dripping from the process nozzle.

Japanese Patent Application Laid-Open No. 2001-232250 (Document 2) proposes a technique for use in a membrane forming apparatus for forming a membrane on a substrate by ejecting a coating liquid onto the substrate. With the technique, a cleaning liquid is ejected to outlets of a coating liquid ejection nozzle to remove contaminants adhering to the outlets, and then, the cleaning liquid ejected to the outlets is sucked to be discharged from the outlets as well as to dry the outlets.

Japanese Patent Application Laid-Open No. 2012-43949 (Document 3) proposes a technique for use in a coating device for forming a coating film on a substrate by applying a processing liquid to the substrate. With the technique, when a nozzle for ejecting a processing liquid from a slit outlet is on standby, the processing liquid in a flow passage of the nozzle is transformed into a solvent of the processing liquid and retained in the form of a solvent. Document 3 also proposes to immerse the tip of the nozzle, in which the processing liquid has been transformed to the solvent, into a solvent retained in a casing.

Japanese Patent Application Laid-Open No. 2006-302934 (Document 4) discloses a technique for use in a liquid treatment apparatus, in which, during standby of a processing liquid supply nozzle, the processing liquid in the nozzle is sucked to form an air layer in the vicinity of an outlet in a flow passage of the nozzle, and the processing liquid is further sucked in a state where the tip of the nozzle is immersed in a solvent of the processing liquid to form a solvent layer on the outer side of the air layer.

Incidentally, as one example of the substrate processing apparatuses, there is known to be an apparatus for processing a substrate by ejecting fine droplets of a processing liquid toward the substrate from a plurality of fine outlets provided in an ejection head. Such an apparatus may suffer from clogging of the outlets due to, for example, drying of the outlets during standby of the ejection head. It is thus conceivable to apply the processing liquid in the vicinity of the outlets to prevent drying of the outlets. There is, however, the possibility that the processing liquid adhering to the ejection head may drop and adhere to a substrate (so-called "liquid dripping") when the use of the ejection head is resumed.

SUMMARY OF INVENTION

The present invention is intended for a substrate processing apparatus for processing a substrate, and it is an object of the present invention to prevent drying of outlets during standby of an ejection head and to prevent liquid dripping during processing on a substrate. The present invention is also intended for a standby method for an ejection head of the substrate processing apparatus.

The substrate processing apparatus according to the present invention includes a substrate holding part for holding a substrate, a cup part surrounding the substrate holding part, an ejection head disposed inside the cup part and above the substrate holding part and for ejecting a processing liquid toward the substrate from an outlet provided in an ejection surface, a supply part movement mechanism for moving the ejection head from a position above the substrate holding part to a standby position outside the cup part, a reservoir disposed outside the cup part and for retaining an immersion liquid in which the ejection surface of the ejection head located at the standby position is immersed, and a liquid removing part for removing the immersion liquid from the ejection surface. With the substrate processing apparatus, it is possible to prevent drying of the outlets during standby of the ejection head and to prevent liquid dripping during processing on the substrate.

In a preferred embodiment of the present invention, the supply part movement mechanism causes relative movement of the ejection head and the reservoir in a direction that the ejection head and the reservoir become closer to each other to immerse the ejection surface of the ejection head in the immersion liquid retained in the reservoir, the ejection surface is separated from the immersion liquid either by discharging the immersion liquid from the reservoir or by the supply part movement mechanism causing relative movement of the ejection head and the reservoir in a direction that the ejection head and the reservoir become away from each other, and after the ejection surface is separated from the immersion liquid, the liquid removing part removes the immersion liquid that remains on the ejection surface.

In another preferred embodiment of the present invention, the processing liquid is continuously or intermittently ejected from the outlet in a state where the ejection surface is immersed in the immersion liquid.

More preferably, the ejection of the processing liquid from the outlet is stopped before the ejection surface is separated from the immersion liquid.

In another preferred embodiment of the present invention, the liquid removing part is a gas emitting part for emitting gas toward the ejection head.

More preferably, the liquid removing part emits the gas in a direction away from the substrate holding part. Or, the liquid removing part emits the gas toward the ejection head inside the reservoir. Still more preferably, the reservoir is provided with a lid part for covering a top of the reservoir, the lid part having an insertion opening through which a lower end portion of the ejection head is inserted.

In another preferred embodiment of the present invention, the immersion liquid is continuously or intermittently supplied and discharged into and from the reservoir in a state where the ejection surface is immersed in the immersion liquid.

More preferably, the immersion liquid is supplied from a bottom of the reservoir and discharged from a top of the reservoir.

In another preferred embodiment of the present invention, the ejection head includes a head body part having an outer surface, part of which is the ejection surface, and for holding the processing liquid therein, and a piezoelectric element attached to the head body part and for vibrating the processing liquid held in the head body part to cause the ejection of the processing liquid from the outlet, and the piezoelectric element is driven to vibrate the immersion liquid retained in the reservoir in a state where the ejection surface is immersed in the immersion liquid.

In another preferred embodiment of the present invention, the immersion liquid is the same type of liquid as the processing liquid.

In another preferred embodiment of the present invention, the ejection surface is formed of a lyophilic material having a high affinity for the immersion liquid.

In another preferred embodiment of the present invention, the substrate is cleaned with the processing liquid ejected from the ejection head toward the substrate.

A standby method for an ejection head according to the present invention is a method of placing the ejection head of a substrate processing apparatus on standby, the ejection head being disposed inside a cup part and above a substrate holding part surrounded by the cup part and being configured to eject a processing liquid from an outlet provided in an ejection surface toward a substrate held by the substrate holding part. The standby method includes a) moving the ejection head from a position inside the cup part to a position outside the cup part, b) causing relative movement of the ejection head and a reservoir in which an immersion liquid is retained, in a direction that the ejection head and the reservoir become closer to each other to immerse the ejection surface of the ejection head in the immersion liquid, c) separating the ejection surface from the immersion liquid either by discharging the immersion liquid from the reservoir or by causing relative movement of the ejection head and the reservoir in a direction that the ejection head and the reservoir become away from each other, d) removing the immersion liquid that remains on the ejection surface, and e) moving the ejection head to a position inside the cup part.

These and other objects, features, aspects and advantages of the present invention will become more apparent from the following detailed description of the present invention when taken in conjunction with the accompanying drawings.

DESCRIPTION OF EMBODIMENTS

Figure 1:
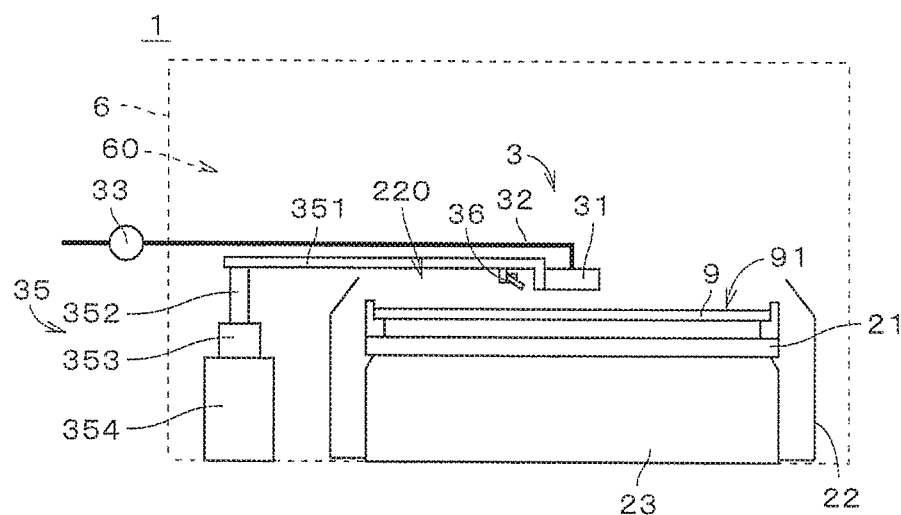
FIG. 1 is a front view of a substrate processing apparatus according to an embodiment of the present invention.
Figure 2:
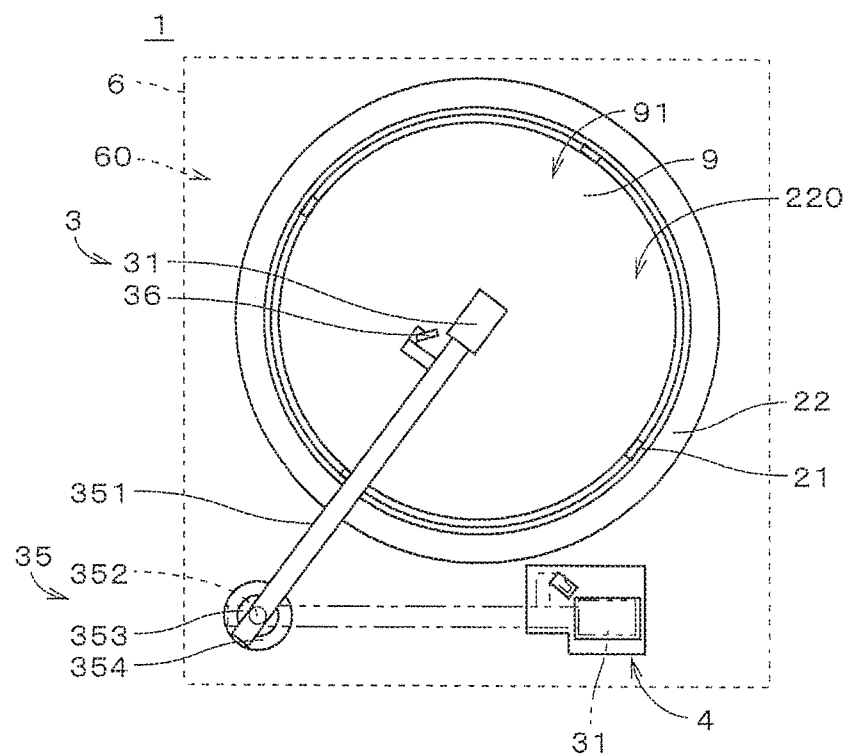
FIG. 2 is a plan view of the substrate processing apparatus.

FIG. 1 is a front view of a substrate processing apparatus 1 according to an embodiment of the present invention. FIG. 2 is a plan view of the substrate processing apparatus 1. An orientation of the substrate processing apparatus 1 in FIG. 2A is different from that in FIG. 1. The substrate processing apparatus 1 is a single-wafer processing apparatus for processing semiconductor substrates 9 (hereinafter, simply referred to as "substrates 9") one at a time. The substrate processing apparatus 1 performs predetermined processing by ejecting a processing liquid toward a substrate 9. In the present embodiment, cleaning processing for removing particles or the like from a substrate 9 is performed by ejecting droplets of a cleaning liquid, which is the processing liquid, onto the substrate 9. The substrate processing apparatus 1 ejects, for example, a spray of droplets, each having a diameter of approximately 20 μm (micrometers), toward a substrate 9.

As shown in FIGS. 1 and 2, the substrate processing apparatus 1 includes a substrate holding part 21, a cup part 22, a substrate rotation mechanism 23, a processing liquid supply part 3, a supply part movement mechanism 35, a protection liquid supply part 36, a head standby part 4, a chamber 6, and a control unit, which will be described later. The chamber 6 houses constituent elements such as the substrate holding part 21, the cup part 22, the substrate rotation mechanism 23, the processing liquid supply part 3, the supply part movement mechanism 35, the protection liquid supply part 36, and the head standby part 4, in its internal space 60. In FIGS. 1 and 2, the chamber 6 is indicated by a broken line and the interior of the chamber 6 is shown.

The substrate holding part 21 holds a substrate 9 with one main surface 91 (hereinafter, referred to as an "upper surface 91") of the substrate 9 facing upward inside the chamber 6. On the upper surface 91 of the substrate 9 is formed a fine pattern such as a circuit pattern. The cup part 22 is a substantially cylindrical member that surrounds the substrate 9 and the substrate holding part 21. The substrate rotation mechanism 23 is disposed under the substrate holding part 21. The substrate rotation mechanism 23 is configured to rotate the substrate 9 together with the substrate holding part 21 in a horizontal plane around a rotation axis that passes through the center of the substrate 9 and that is perpendicular to the upper surface 91 of the substrate 9.

The processing liquid supply part 3 includes an ejection head 31 for ejecting a processing liquid downward, and processing liquid piping 32 connected to the ejection head 31, and a pump 33 for pumping a processing liquid supplied from a processing liquid supply source disposed outside the substrate processing apparatus 1, toward the ejection head 31 through the processing liquid piping 32. The processing liquid piping 32 includes processing liquid supply piping 318 (see FIG. 4) for supplying the processing liquid to the ejection head 31, and processing liquid collection piping 319 (see FIG. 4) for collecting the processing liquid discharged from the ejection head 31. The ejection head 31 is disposed above the substrate holding part 21 inside the cup part 22. In other words, a lower surface of the ejection head 31 is located between an upper opening 220 of the cup part 22 and the upper surface 91 of the substrate 9. The ejection head 31 is a device for continuously ejecting fine mutually separated droplets of liquid from a plurality of outlets, which will be described later. The ejection head 31 ejects fine droplets of the processing liquid toward the upper surface 91 of the substrate 9. Examples of the processing liquid include liquids such as pure water (preferably, deionized water (DIW)), carbonated water, and a mixture of aqueous ammonia and a hydrogen peroxide solution. A design ejection direction in which the ejection head 31 ejects the processing liquid is substantially parallel to the vertical direction (i.e., the direction of gravity).

Figure 3:
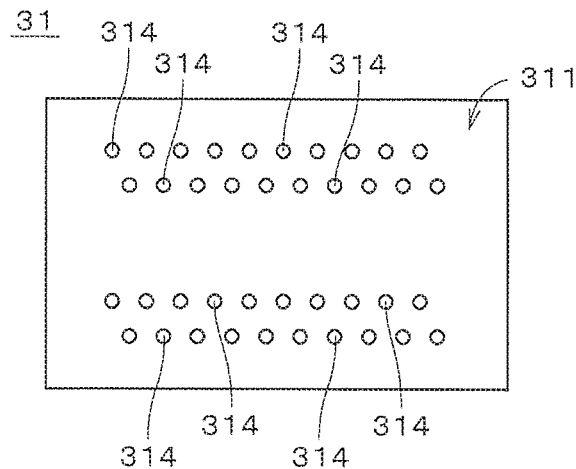
FIG. 3 is a bottom view of an ejection head.

FIG. 3 is a bottom view showing the lower surface 311 of the ejection head 31. In the lower surface 311 of the ejection head 31 are provided a plurality of fine outlets 314. Hereinafter, the lower surface 311 of the ejection head 31 is referred to as an "ejection surface 311." The outlets 314 form four outlet rows that each extended substantially linearly in the lateral direction in FIG. 3. The outlet rows each have a plurality of outlets 314 arranged at a predetermined arrangement pitch. The outlets 314 each have a diameter of approximately 5 to 10 μm. FIG. 3 shows the outlets 314 larger than their actual size and shows a smaller number of outlets 314 than their actual number. As will be described later, the ejection head 31 is moved between a position opposite the substrate 9 and a position opposite the head standby part 4 by the supply part movement mechanism 35, but regardless of this movement, the ejection surface 311 of the ejection head 31 is maintained in a substantially horizontal position.

Figure 4:
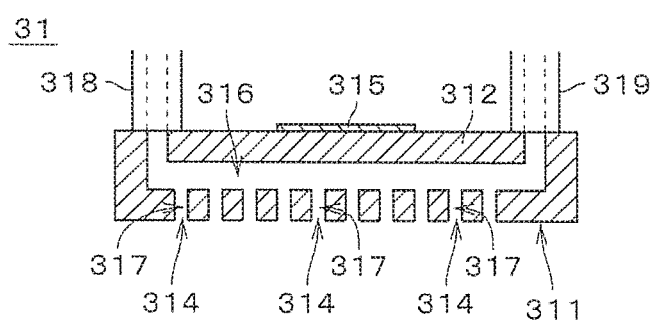
FIG. 4 is a cross-sectional view of the ejection head.

FIG. 4 is a longitudinal cross-sectional view of the ejection head 31. The ejection head 31 includes a head body part 312 and a piezoelectric element 315. Inside the head body part 312 is provided a processing liquid holding part 316 that forms a space for holding the processing liquid. One end of the processing liquid holding part 316 is connected to the pump 33 and a processing liquid supply source for supplying the processing liquid to the ejection head 31 through the processing liquid supply piping 318. The other end of the processing liquid holding part 316 is connected to a processing liquid collecting part for collecting the processing liquid ejected from the ejection head 31 through the processing liquid collection piping 319. The processing liquid collecting part is disposed outside the substrate processing apparatus 1. The lower surface of the head body part 312, which is part of the outer surface of the head body part 312, is the aforementioned ejection surface 311. The outlets 314 are each connected to the processing liquid holding part 316 via its processing liquid flow passage 317. The piezoelectric element 315 is attached to the upper surface of the head body part 312. The piezoelectric element 315 vibrates the processing liquid in the head body part 312 via the head body part 312 so as to cause the respective outlets 314 to eject fine droplets of the processing liquid.

The head body part 312, including the ejection surface 311, is formed of a lyophilic material having a high affinity for an immersion liquid 49 (see FIG. 7), which will be described later. When the immersion liquid 49 is pure water, the head body part 312, including the ejection surface 311, is formed of a hydrophilic material.

As shown in FIGS. 1 and 2, the supply part movement mechanism 35 includes an arm 351, a rotation shaft 352, a head rotation mechanism 353, and a head elevating mechanism 354. The arm 351 extends in a horizontal direction from the rotation shaft 352. The arm 351 has the ejection head 31 attached to its tip. The head rotation mechanism 353 is configured to rotate the ejection head 31 together with the arm 351 around the rotation shaft 352 in the horizontal direction. The head elevating mechanism 354 is configured to move the ejection head 31 together with the arm 351 in the vertical direction. The head rotation mechanism 353 includes, for example, an electric motor. The head elevating mechanism 354 includes, for example, a ball screw mechanism and an electric motor.

The protection liquid supply part 36 is directly or indirectly fixed to the ejection head 31 and ejects a protection liquid obliquely downwardly. In the example shown in FIGS. 1 and 2, the protection liquid supply part 36 is attached to the arm 351 and indirectly fixed to the ejection head 31. Examples of the protection liquid include liquids such as pure water (preferably, deionized water), carbonated water, and a mixture of aqueous ammonia and a hydrogen peroxide solution, similarly to the aforementioned processing liquid. The protection liquid may be a liquid of the same type as the processing liquid or may be a liquid of a different type.

With the substrate processing apparatus 1, the protection liquid ejected in the form of a liquid column from the protection liquid supply part 36 toward the upper surface 91 of the substrate 9 spreads over the substrate 9 under the ejection head 31 and forms a film of the protection liquid (hereinafter, referred to as a "protection liquid film") having a predetermined thickness directly under the ejection head 31. The protection liquid supply part 36 is moved together with the ejection head 31 by the head rotation mechanism 353 and the head elevating mechanism 354.

Figure 5:
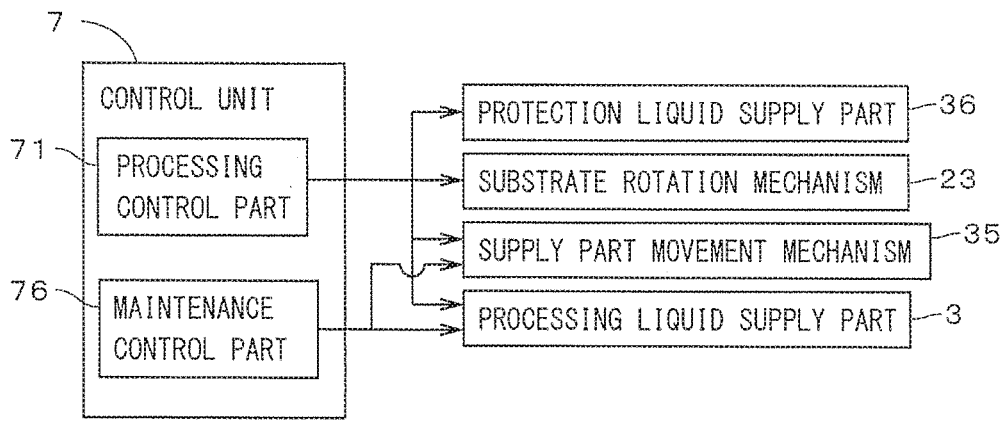
FIG. 5 is a block diagram showing functions of a control unit.

FIG. 5 is a block diagram showing functions of the control unit 7. FIG. 5 also shows constituent elements other than the control unit 7. The control unit 7 includes a processing control part 71 and a maintenance control part 76.

When the substrate processing apparatus 1 shown in FIGS. 1 and 2 performs processing on a substrate 9, first the substrate 9 is transported into the chamber 6 and held by the substrate holding part 21. During the transport of the substrate 9, the ejection head 31 is waiting at a position above the head standby part 4 disposed outside the cup part 22, as indicated by the dashed double-dotted line in FIG. 2. When the substrate 9 is held by the substrate holding part 21, the processing control part 71 drives the substrate rotation mechanism 23 to start the rotation of the substrate 9.

Next, the processing control part 71 drives the head rotation mechanism 353 and the head elevating mechanism 354 of the supply part movement mechanism 35 so that the ejection head 31 and the protection liquid supply part 36 are moved up from the position above the head standby part 4 and rotated, then moved to a position above the cup part 22, and then moved down. Accordingly, the ejection head 31 and the protection liquid supply part 36 are moved through the upper opening 220 of the cup part 22 to the inside of the cup part 22 and to a position above the substrate holding part 21. Then, the protection liquid supply part 36 starts the supply of the protection liquid to the substrate 9, forming the protection liquid film that covers a portion of the upper surface 91 of the substrate 9. Also, the ejection head 31 starts the ejection of the processing liquid (i.e., a jet of fine droplets) from the outlets 314 (see FIG. 3) toward the upper surface 91 of the substrate 9 on which the protection liquid film has been formed. The protection liquid film covers a plurality of design landing points (i.e., landing points of fine droplets) of the processing liquid ejected from the outlets 314 on the substrate 9.

A large number of fine droplets ejected from the ejection head 31 toward the protection liquid film collide with the protection liquid film on the upper surface 91 of the substrate 9 and indirectly collide with the upper surface 91 of the substrate 9 via the protection liquid film. The impact of the collision of fine droplets of the processing liquid causes extraneous materials such as particles that adhere to the upper surface 91 of the substrate 9 to be removed from the substrate 9. In other words, the fine droplets of the processing liquid indirectly transfer kinetic energy (i.e., indirectly apply kinetic energy) to the substrate 9 via the protection liquid film, and with this kinetic energy, the processing for cleaning the upper surface 91 of the substrate 9 is performed.

Such indirect collision of fine droplets of the processing liquid with the substrate 9 via the protection liquid film prevents or reduces the possibility of damage to a pattern or the like formed on the upper surface 91 of the substrate 9 during the processing for cleaning the substrate 9, as compared with direct collision of fine droplets with the substrate 9. In addition, the protection liquid that covers the area where the cleaning processing is performed on the substrate 9 prevents or reduces the possibility that particles or the like once removed from the substrate 9 will again adhere to the upper surface 91 of the substrate 9.

In the substrate processing apparatus 1, in parallel with the ejection of the protection liquid and the processing liquid, the head rotation mechanism 353 turns the ejection head 31 and the protection liquid supply part 36. The ejection head 31 and the protection liquid supply part 36 repeat horizontal reciprocating motion between a position above the center portion of the rotating substrate 9 and a position above the outer edge of the substrate 9. Accordingly, the entire upper surface 91 of the substrate 9 is cleaned. The rotation of the substrate 9 causes the protection liquid and the processing liquid that have been supplied to the upper surface 91 of the substrate 9 to be dispersed from the edge of the substrate 9 to the outside. The protection liquid and the processing liquid that have been dispersed from the substrate 9 are received by the cup part 22 and either discarded or collected.

After predetermined processing (i.e., the processing for cleaning the substrate 9) using the processing liquid ejected from the ejection head 31 has ended, the ejection of the protection liquid and the processing liquid is stopped. The ejection head 31 and the protection liquid supply part 36 are moved up to a position above the upper opening 220 of the cup part 22 by the head elevating mechanism 354 and are then moved from a position above the substrate holding part 21 and the substrate 9 to a position above the head standby part 4 by the head rotation mechanism 353.

Figure 6:
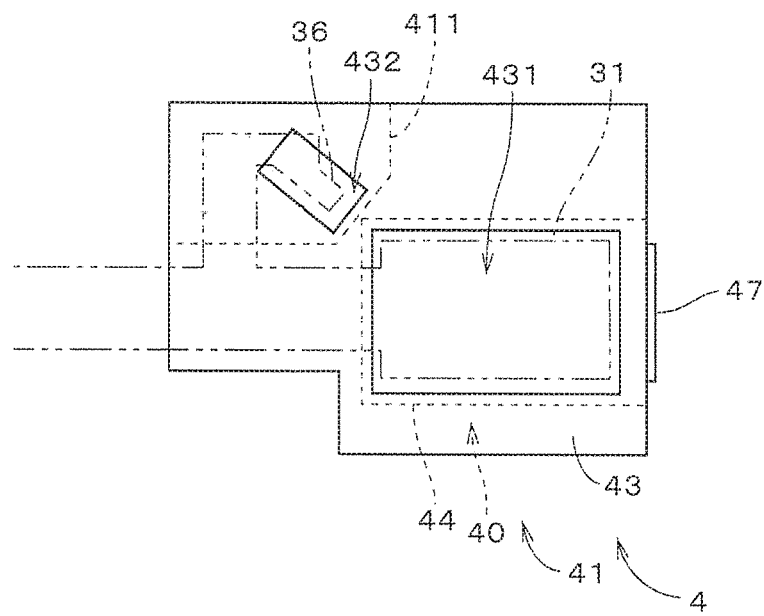
FIG. 6 is a plan view of a head standby part.
Figure 7:
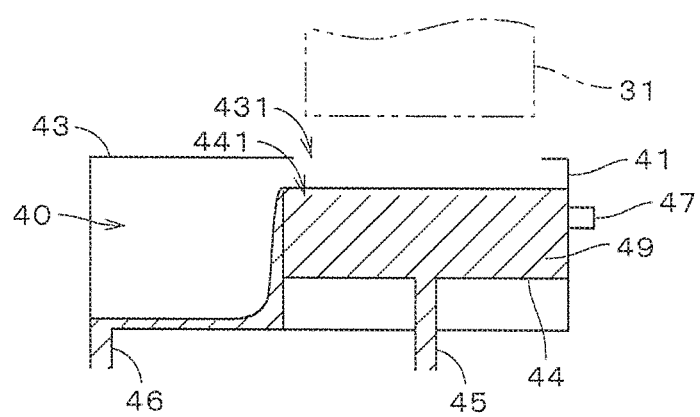
FIG. 7 illustrates the head standby part and the ejection head.

FIG. 6 is an enlarged plan view of the head standby part 4. The head standby part 4 includes a standby pod 41 and a liquid removing part 47. FIG. 7 is a longitudinal cross-sectional view of the head standby part 4, showing the outer wall or the like of the standby pod 41 in cross section. In FIGS. 6 and 7, the ejection head 31 and other constituent elements located above the head standby part 4 are indicated by dashed double-dotted lines. The standby pod 41 shown in FIGS. 6 and 7 is a container disposed outside the cup part 22 (see FIGS. 1 and 2) and having a substantially rectangular parallelepiped shape, and is capable of retaining a liquid therein. Specifically, the liquid 49 (hereinafter, referred to as the "immersion liquid 49") is retained in a reservoir 44 disposed in an internal space 40 of the standby pod 41.

Examples of the immersion liquid 49 include liquids such as pure water (preferably, deionized water (DIW)), carbonated water, and a mixture of aqueous ammonia and a hydrogen peroxide solution. The immersion liquid 49 may be a liquid of the same type as the processing liquid ejected from the ejection head 31, or may be a liquid of a different type. Preferably, the immersion liquid 49 is the same type of liquid as the aforementioned processing liquid.

The top of the internal space 40 of the standby pod 41 is covered with a lid part 43. The lid part 43 has a first opening 431 and a second opening 432 that correspond respectively to the ejection head 31 and the protection liquid supply part 36. FIG. 7 shows only the ejection head 31 and does not show the protection liquid supply part 36 (the same applies to FIGS. 9, 10, and 12).

The reservoir 44 is a container having a substantially rectangular parallelepiped shape and is open at the top. The top of the reservoir 44 is covered with the aforementioned lid part 43, and the reservoir 44 is disposed under the first opening 431 of the lid part 43. As shown in FIG. 7, the bottom of the reservoir 44 is connected to immersion liquid piping 45. The immersion liquid piping 45 leads the immersion liquid 49, which is supplied from an immersion liquid supply source outside the substrate processing apparatus 1, to the reservoir 44 provided in the standby pod 41. The immersion liquid 49 supplied from the bottom of the reservoir 44 flows upward in the reservoir 44, spills from an upper opening 441 of the reservoir 44, and is discharged from the reservoir 44. The liquid level of the immersion liquid 49 in the reservoir 44 is thus substantially the same as the level of the upper opening 441 of the reservoir 44. The immersion liquid 49 discharged from the top of the reservoir 44 flows through an immersion liquid exhaust pipe 46 provided in the bottom of the standby pod 41 and is discharged to the outside of the substrate processing apparatus 1. Note that the immersion liquid piping 45 is connected not only to the immersion liquid supply source but also to a suction mechanism (not shown) for sucking the liquid or the like in the reservoir 44.

The liquid removing part 47 is provided on the outer side surface of the standby pod 41. The side surface to which the liquid removing part 47 is fixed is also the side surface of the reservoir 44. Thus, it can be considered that the liquid removing part 47 is provided on the outer side surface of the reservoir 44. The liquid removing part 47 is a gas emitting part for emitting gas such as nitrogen gas in a substantially horizontal direction. The liquid removing part 47 is located below the upper opening 441 of the reservoir 44 (i.e., below the liquid level of the immersion liquid 49) and is thus capable of emitting the aforementioned gas to the interior of the reservoir 44 in a substantially horizontal direction. The height of the liquid removing part 47 is set to be substantially the same as the height of the ejection surface 311 of the ejection head 31 that is standing by while being immersed in the immersion liquid 49.

Figure 8:
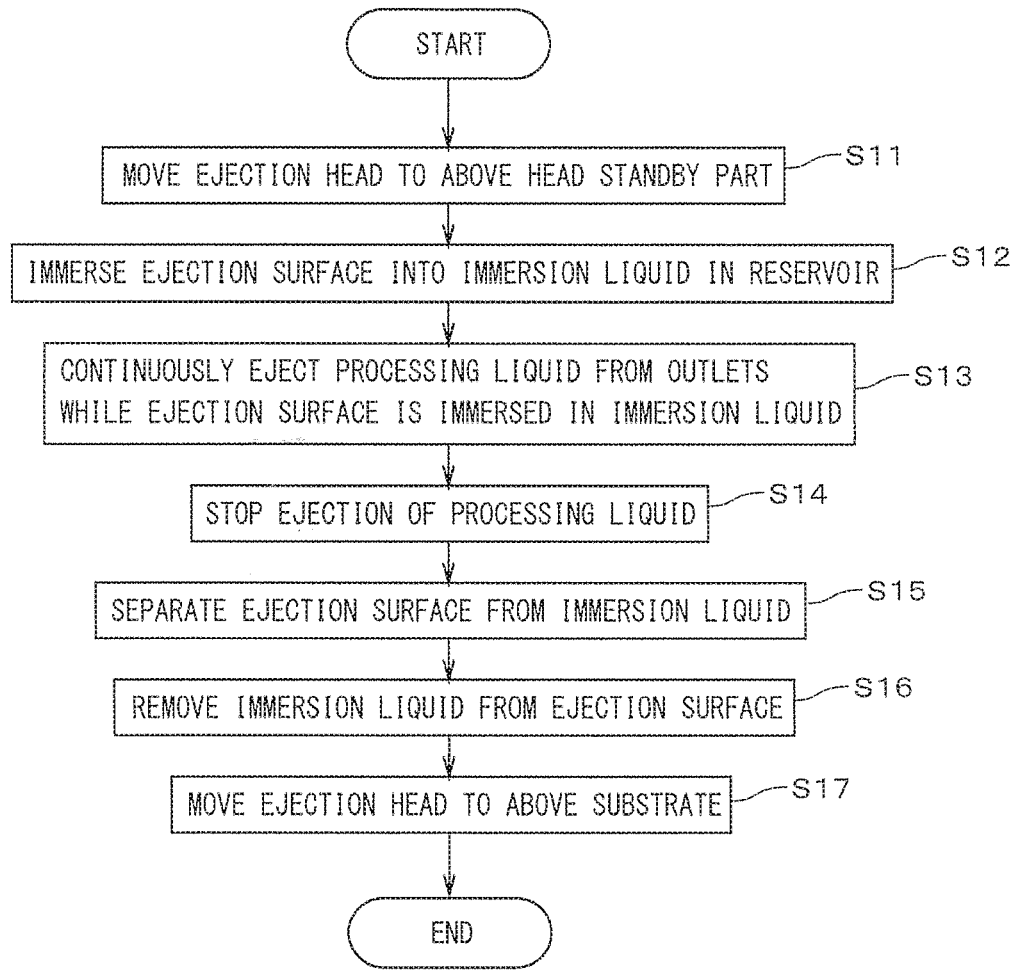
FIG. 8 is a flowchart of a standby operation of the ejection head.

FIG. 8 is a flowchart of a standby operation of the ejection head 31 after having completed processing on a substrate 9. The ejection head 31 that has completed processing on a substrate 9 is, as described above, moved from the inside of the cup part 22 to the outside of the cup part 22 and located above the head standby part 4 by the head rotation mechanism 353 and the head elevating mechanism 354 of the supply part movement mechanism 35 (step S11).

Figure 9:
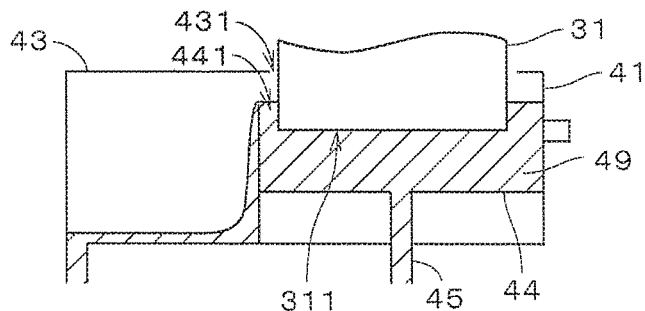
FIGS. 9 and 10 illustrate the head standby part and the ejection head.

Subsequently, the maintenance control part 76 controls the head elevating mechanism 354 to move the ejection head 31 down toward the standby pod 41. Then, as shown in FIG. 9, the lower end portion of the ejection head 31 is inserted into the standby pod 41 through the first opening 431 of the lid part 43 and is received in the standby pod 41. The first opening 431 is an insertion opening through which the lower end portion of the ejection head 31 is inserted. In the following description, the position of the ejection head 31 shown in FIG. 9 is referred to as a "standby position."

In the standby pod 41, the lower end portion of the ejection head 31 located at the standby position is immersed in the immersion liquid 49 retained in advance in the reservoir 44. Specifically, the ejection surface 311 and a portion of the side surface of the ejection head 31 up to approximately 5 mm above the ejection surface 311 are immersed in the immersion liquid 49 (step S12). The ejection surface 311 is accordingly covered with the immersion liquid 49 and isolated from the atmosphere in the chamber 6. A vertical position of the ejection head 31 located at the standby position, i.e., a vertical position of the ejection head 31 in a state where the ejection surface 311 of the ejection head 31 is immersed in the immersion liquid 49 is the same as a vertical position of the ejection head 31 when ejecting the processing liquid toward the substrate 9 (see FIG. 1). The immersion liquid 49 is stored into the reservoir 44 while, for example, the ejection head 31 is ejecting the processing liquid to the substrate 9.

When the ejection head 31 moves from the position shown in FIG. 7 (i.e., the position above the standby position) down to the standby position shown in FIG. 9 so that the ejection surface 311 is immersed into the immersion liquid 49 in the reservoir 44, the protection liquid supply part 36 shown in FIG. 6 also moves downward together with the ejection head 31. The protection liquid supply part 36 is inserted in the standby pod 41 through the second opening 432 of the lid part 43 and is received in the standby pod 41. In the standby pod 41, a space in which the lower end portion of the ejection head 31 is received and a space in which the protection liquid supply part 36 is received are isolated from each other by a dividing wall 411. There is no liquid retained in the space in which the protection liquid supply part 36 is received.

Until next use, the ejection head 31 waits at the standby position shown FIG. 9 in a state in which its ejection surface 311 is immersed in the immersion liquid 49. The ejection head 31 on standby continuously ejects the processing liquid from the outlets 314 (see FIG. 3) under control of the maintenance control part 76 (step S13). The quantity of flow of the processing liquid ejected from the ejection head 31 at the standby position into the immersion liquid 49 is smaller than that ejected from the ejection head 31 during the aforementioned processing on the substrate 9 toward the substrate 9. In other words, the ejection head 31 at the standby position causes so-called "slow leakage" of the processing liquid. Note that the ejection head 31 on standby does not necessarily have to continuously eject the processing liquid, and may intermittently eject the processing liquid. However, from the viewpoint of further reducing the possibility of clogging of the outlets 314, it is preferable for the ejection head 31 to continuously eject the processing liquid.

In the head standby part 4, the immersion liquid 49 is continuously supplied into the reservoir 44 from the immersion liquid piping 45 and is continuously discharged from the upper opening 441 of the reservoir 44, in a state in which the ejection surface 311 is immersed in the immersion liquid 49. Accordingly, the flow of the immersion liquid 49 from the bottom to the top is always maintained in the reservoir 44.

Figure 10:
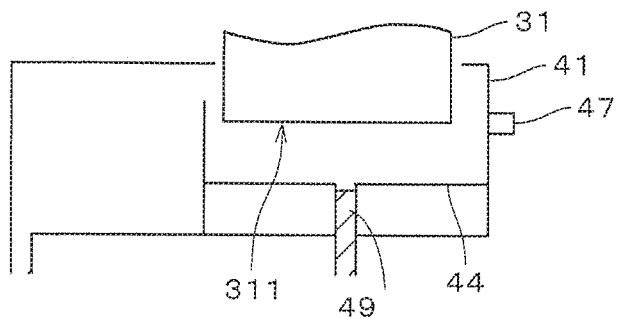

When the ejection head 31 resumes processing on a substrate 9, the ejection head 31 stops ejecting the processing liquid (slow leakage) from the outlets 314 under control of the maintenance control part 76 (step S14). The supply of the immersion liquid 49 from the immersion liquid piping 45 is also stopped. Subsequently, the aforementioned suction mechanism connected to the immersion liquid piping 45 is driven to discharge the immersion liquid 49 in the reservoir 44 through the immersion liquid piping 45 to the outside of the reservoir 44. Accordingly, as shown in FIG. 10, the ejection surface 311 of the ejection head 31 is separated from the immersion liquid 49 retained in the reservoir 44 (step S15). It is preferable that the slow leakage from the outlets 314 be stopped immediately before the ejection surface 311 is separated from the immersion liquid 49.

When the ejection surface 311 is separated from the immersion liquid 49, the ejection surface 311 and the liquid removing part 47 are both exposed to the atmosphere in the reservoir 44. Next, the maintenance control part 76 controls the liquid removing part 47 to emit gas in a substantially horizontal direction toward the ejection head 31 located at the standby position. The liquid removing part 47 emits the gas to the ejection surface 311 of the ejection head 31 and to an area in the vicinity of the ejection surface 311. Accordingly, the immersion liquid 49 adhering to (i.e., remaining on) the ejection surface 311 and to the area in the vicinity of the ejection surface 311 is blown and removed (step S16). Since, as described previously, the height of the liquid removing part 47 is set to be substantially the same as the height of the ejection surface 311 of the ejection head 31 that is being immersed in the immersion liquid 49, it is possible, by merely discharging the immersion liquid 49 from the reservoir 44, to immediately emit the gas from the liquid removing part 47 toward the ejection surface 311 without moving the ejection head 31 in the vertical direction. Therefore, the emission of the gas from the liquid removing part 47 is conducted within the reservoir 44 (i.e., within the standby pod 41).

When the immersion liquid 49 has been removed from the ejection surface 311, the ejection head 31 is moved up from the standby position to the outside of the standby pod 41 by the head elevating mechanism 354. The ejection head 31 is then turned to a position above the substrate 9 by the head rotation mechanism 353 and is then moved down toward the inside of the cup part 22 by the head elevating mechanism 354 (step S17). After this, as previously described, the ejection head 31 performs processing on the substrate 9.

As described above, in the substrate processing apparatus 1, the ejection surface 311 of the ejection head 31 located at the standby position during standby is immersed in the immersion liquid 49 retained in the reservoir 44. This prevents drying of the outlets 314 provided in the ejection surface 311 and drying of the processing liquid flow passages 317 that communicate with the outlets 314. Consequently, it is possible to reduce or prevent the possibility of clogging of the fine outlets 314. It is also possible to prevent mist or the like in the chamber 6 from adhering to the ejection surface 311 of the ejection head 31 during standby.

Figure 11:
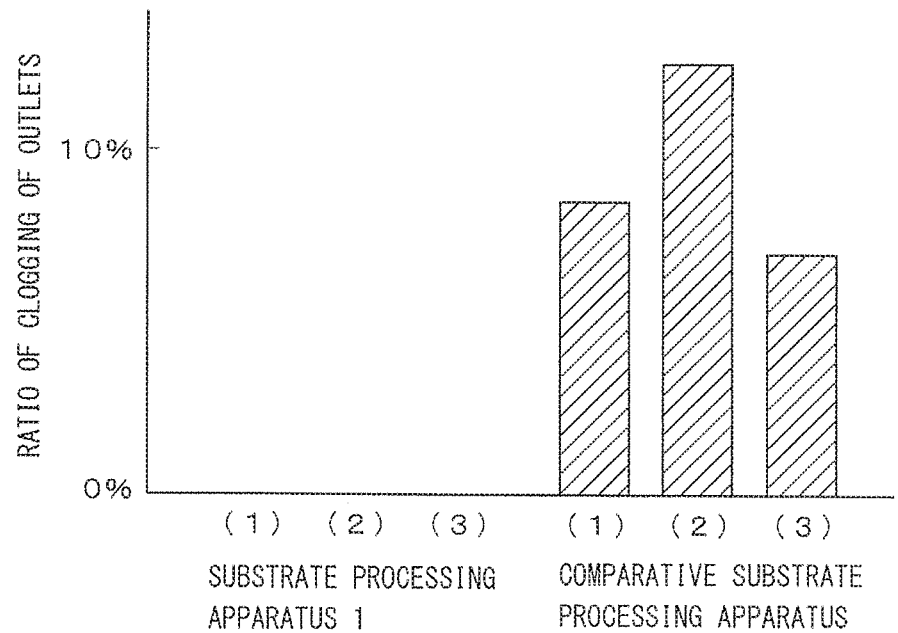
FIG. 11 shows the ratio of clogging of outlets.

FIG. 11 shows a comparison in the ratio of clogging of outlets during standby between the above-described substrate processing apparatus 1 and a substrate processing apparatus in a comparative example (hereinafter referred to as a "comparative substrate processing apparatus"). In the comparative substrate processing apparatus, the ejection head is placed on standby in a state in which the lower end portion of an ejection head is inserted in a standby pod, with no immersion liquid being retained in a reservoir, and the ejection of a processing liquid from outlets is stopped. Specifically, in the comparative substrate processing apparatus, the ejection surface of the ejection head is exposed to the atmosphere and is thus gradually drying since the start of the standby state.

On the other hand, in the substrate processing apparatus 1 according to the present embodiment of the present invention, the ejection head 31 is placed on standby in a state in which the ejection surface 311 is immersed in the immersion liquid 49 retained in the reservoir 44, as described above. It is, however, noted that, for easy understanding of the comparison with the comparative substrate processing apparatus, the aforementioned ejection (slow leakage) of the processing liquid from the ejection head 31 to the immersion liquid 49 is stopped in this comparative test. The vertical axis in FIG. 11 indicates the ratio of the number of outlets that caused clogging after one-week standby to the total number of outlets. Numbers (1), (2), and (3) given along the horizontal axis in FIG. 11 indicate three ejection heads having the same structure, which are used in testing each of the substrate processing apparatus 1 and the comparative substrate processing apparatus. As shown in FIG. 11, about 10% of the outlets in the comparative substrate processing apparatus caused clogging one week after the start of standby, whereas no outlets 314 caused clogging in the substrate processing apparatus 1.

As described above, in the substrate processing apparatus 1, the immersion liquid 49 adhering to the ejection surface 311 is removed by the liquid removing part 47 when the ejection head 31 resumes processing on a substrate 9. Accordingly, it is possible to prevent a liquid such as the immersion liquid 49 remaining on the ejection surface 311 from dropping and adhering to the substrate 9 (so-called "liquid dripping") when, for example, the ejection head 31 moves to a position above the substrate 9. In this way, the substrate processing apparatus 1 can prevent liquid dripping from the ejection head 31. The structure of the substrate processing apparatus 1 is thus particularly suitable for use in processing for cleaning a substrate 9, in which it is important to maintain the substrate 9 clean.

In the substrate processing apparatus 1, the ejection surface 311 can be easily immersed into the immersion liquid 49 by moving the ejection head 31 down toward the reservoir 44 in which the immersion liquid 49 is retained. Also, the ejection surface 311 can be easily separated from the immersion liquid 49 by discharging the immersion liquid 49 from the reservoir 44. Moreover, the immersion liquid 49 can be easily removed from the ejection surface 311 by driving the liquid removing part 47 after the ejection surface 311 has been separated from the immersion liquid 49.

As described above, the head standby part 4 causes the liquid removing part 47 to emit gas toward the ejection head 31, thereby making it possible to remove the immersion liquid 49 from the ejection surface 311 with a simple configuration. Also, performing the emission of gas to the ejection head 31 within the reservoir 44 reduces the possibility that mist or the like of the immersion liquid 49 removed from (i.e., blown off) the ejection surface 311 will be diffused to the outside of the reservoir 44. It is thus possible to suppress diffusion of mist or the like of the immersion liquid 49 to the surroundings of the head standby part 4 and consequently to suppress adhesion of mist or the like of the immersion liquid 49 to the substrate 9.

By providing the lid part 43 covering the top of the reservoir 44, it is possible to reduce the possibility that mist or the like of immersion liquid 49 that has been diffused to the outside of the reservoir 44 will be diffused to the outside of the standby pod 41. This further suppresses diffusion of mist or the like of the immersion liquid 49 to the surroundings of the head standby part 4. Note that the leakage of mist or the like from the first opening 431 of the lid part 43 is suppressed by the ejection head 31 inserted in the first opening 431.

In the head standby part 4, the liquid removing part 47 does not necessarily have to emit gas toward the ejection surface 311 that is located within the reservoir 44. For example, the liquid removing part 47 may emit gas toward such an ejection surface 311 that is located above the reservoir 44 within the standby pod 41 as a result of the ejection head 31 having moved slightly up from the standby position. In this case, it is also possible as described above to suppress diffusion of mist or the like of the immersion liquid 49 to the surroundings of the head standby part 4.

Figure 12:
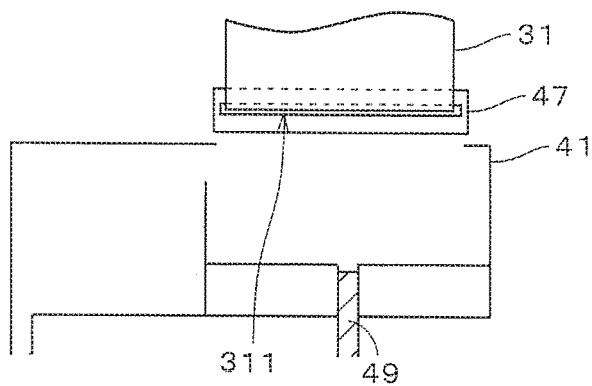
FIG. 12 illustrates the head standby part and the ejection head.
Figure 13:
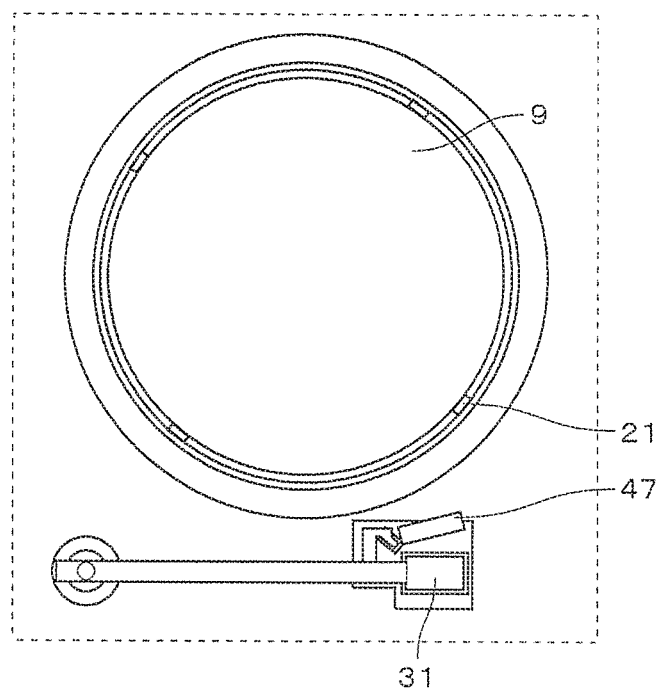
FIG. 13 is a plan view of the substrate processing apparatus.

A configuration as shown in FIG. 12 is also possible in which the liquid removing part 47 is disposed above the standby pod 41 and emit gas toward the ejection surface 311 of the ejection head 31 that is moved up from the standby position and located at a position above the standby pod 41. In this case, it is preferable for the liquid removing part 47 to be disposed between the ejection head 31 located at the standby position and the substrate holding part 21 such that the liquid removing part 47 emits gas in a direction away from the substrate holding part 21, as shown in FIG. 13. This reduces the possibility that mist or the like of the immersion liquid 49 removed from the ejection surface 311 will be diffused in a direction toward the substrate holding part 21. Consequently, it is possible to suppress adhesion of mist or the like of the immersion liquid 49 to the substrate 9.

As described above, in the substrate processing apparatus 1, the processing liquid is continuously or intermittently ejected from the outlets 314 in a state in which the ejection surface 311 is immersed in the immersion liquid 49. Accordingly, even if particles or the like are mixed into the immersion liquid 49 retained in the reservoir 44, it is possible to reduce or prevent the possibility that such particles or the like will adhere to the ejection surface 311, or will enter the ejection head 31 from the outlets 314. Moreover, the ejection of the processing liquid from the outlets 314 of the ejection head 31 is stopped before the ejection surface 311 is separated from the immersion liquid 49. This allows the liquids on the ejection surface 311 to more easily drop off when the ejection surface 311 is separated from the immersion liquid 49, thus reducing the amount of the immersion liquid 49 remaining on the ejection surface 311. Consequently, the liquid removing part 47 can speedily and readily remove the immersion liquid 49 from the ejection surface 311.

In addition, since the ejection surface 311 is formed of a lyophilic material having a high affinity for the immersion liquid 49, the immersion liquid 49 in contact with the area in the vicinity of the ejection surface 311 is easy to move to the ejection surface 311, which is the lower end of the ejection head 31, when the ejection surface 311 is separated from the immersion liquid 49. Also, the immersion liquid 49 collected around the ejection surface 311 is collectively separated from the ejection surface 311. Accordingly, the immersion liquid 49 will hardly remain on the ejection surface 311, and therefore the liquid removing part 47 can more speedily and more readily remove the immersion liquid 49 from the ejection surface 311.

In the head standby part 4, the immersion liquid 49 is continuously supplied and discharged into and from the reservoir 44 in a state in which the ejection surface 311 is immersed in the immersion liquid 49. Thus, particles or the like adhering to the surface of the ejection head 31 can be washed away. Also, the immersion liquid 49 in the reservoir 44 can be maintained always new and clean. In other words, it is possible to reduce the possibility that the immersion liquid 49 in the reservoir 44 will become polluted due to the entry of, for example, particles floating in the atmosphere or particles adhering to the ejection head 31. Consequently, it is possible to suppress or prevent the entry of particles or the like from the outlets 314 into the ejection head 31. Moreover, the reservoir 44 is configured such that the immersion liquid 49 is supplied from the bottom of the reservoir 44 and discharged from the top of the reservoir 44. This configuration allows the new and clean immersion liquid 49 to be always supplied to the ejection surface 311. Consequently, it is possible to further suppress or prevent the possibility that particles or the like will adhere to the ejection surface 311 or will enter the ejection head 31 from the outlets 314. Note that the immersion liquid 49 may be intermittently supplied and discharged into and from the reservoir 44. However, from the viewpoint of maintaining the immersion liquid 49 in the reservoir 44 always new and clean, it is preferable that the immersion liquid 49 be continuously supplied and discharged into and from the reservoir 44.

In the substrate processing apparatus 1, as described above, the immersion liquid 49 in the reservoir 44 is the same type of liquid as the processing liquid ejected from the ejection head 31. There is thus no possibility that the mixture of the immersion liquid 49 and the processing liquid will cause adverse effects. Accordingly, there will be no problem if the immersion liquid 49 enters the outlets 314 during standby of the ejection head 31. This further eliminates the need for an operation such as flushing for discharging the immersion liquid 49 in the outlets 314 when the use of the ejection head 31 is resumed.

As described above, in the substrate processing apparatus 1, the vertical position of the ejection head 31 located at the standby position is equal to the vertical position of the ejection head 31 located when ejecting the processing liquid toward the substrate 9. This simplifies the configuration and control of the head elevating mechanism 354.

In the substrate processing apparatus 1, in a state where the ejection surface 311 of the ejection head 31 is immersed in the immersion liquid 49 retained in the reservoir 44, the piezoelectric element 315 of the ejection head 31 may be driven to vibrate the immersion liquid 49 in the reservoir 44 via the head body part 312. Through this, it is possible to clean the lower end portion of the ejection head 31 and to efficiently remove particles or the like adhering to the surface of that lower end portion (i.e., the ejection surface 311 and an area of the side surface in the vicinity of the ejection surface 311).

In the substrate processing apparatus 1, separating the ejection surface 311 from the immersion liquid 49 in step S15 does not always have to be done by discharging the immersion liquid 49 in the reservoir 44. For example, the ejection surface 311 may be separated from the immersion liquid 49 by the head elevating mechanism 354 of the supply part movement mechanism 35 moving the ejection head 31 up from the standby position to a position above the reservoir 44. Even in this case, the ejection surface 311 can be easily separated from the immersion liquid 49.

The substrate processing apparatus 1 described above can be modified in various ways.

The ejection surface 311 may be formed of a material that has a low affinity for the immersion liquid 49. In this case, the liquid removing part 47 can easily blow the immersion liquid 49 off the ejection surface 311. The liquid removing part 47 does not necessarily have to emit gas toward the ejection head 31, and for example, it may suck and remove the immersion liquid 49 on the ejection surface 311 together with the gas around the ejection surface 311. Alternatively, the immersion liquid 49 adhering to the ejection surface 311 may be vaporized and removed by heating, for example.

The immersion liquid 49 does not necessarily have to be supplied from the bottom of the reservoir 44 into the reservoir 44, and also, the immersion liquid 49 does not necessarily have to be discharged from the upper opening 411 of the reservoir 44. The positions at which the immersion liquid 49 are supplied and discharged may be appropriately selected from any place on the surface of the reservoir 44.

If, as described above, the processing liquid ejected from the ejection head 31 is the same type of liquid as the immersion liquid 49, the processing liquid ejected from the ejection head 31 may be retained in the reservoir 44 in parallel with or in place of the supply of the immersion liquid 49 from the immersion liquid piping 45.

Immersing the ejection surface 311 into the immersion liquid 49 in the reservoir 44 does not always have to be done by moving the ejection head 31 downward, and it is sufficient that relative movement of the ejection head 31 and the reservoir 44 is caused in a direction that they become closer to each other. For example, the ejection surface 311 may be immersed into the immersion liquid 49 by moving the reservoir 44, in which the immersion liquid 49 is retained, upward from under the ejection head 31 while the ejection head 31 remains at its position. Also, separating the ejection surface 311 from the immersion liquid 49 in the reservoir 44 does not always have to be done by discharging the immersion liquid 49 from the reservoir 44 and moving the ejection head 31 upward. For example, the ejection surface 311 may be separated from the immersion liquid 49 in the reservoir 44 by moving the reservoir 44 down while the ejection bead 31 remains at its position. In other words, the ejection surface 311 is separated from the immersion liquid 49 in the reservoir 44 by relative movement of the ejection head 31 and the reservoir 44 in a direction that they become away from each other.

The head standby part 4 may use part or the whole of the internal space 40 of the standby pod 41 as the reservoir 44 for retaining the immersion liquid 49.

The processing liquid ejected from the ejection head 31 does not necessarily have to be in the form of droplets, and the ejection head 31 may eject a continuous flow of the processing liquid in the form of a liquid column. The structure of the substrate processing apparatus 1 may be applied to a substrate processing apparatus provided with an ejection head having only a single outlet.

The substrate processing apparatus 1 is applicable to various types of processing other than cleaning the substrate 9. The substrate processing apparatus 1 may be used for processing on substrates other than semiconductor substrates, such as glass substrates used in display devices such as liquid crystal displays, plasma displays, and FEDs (field emission displays). The substrate processing apparatus 1 may also be used for processing on other substrates such as optical disk substrates, magnetic disk substrates, magneto-optical disk substrates, photomask substrates, ceramic substrates, and solar cell substrates.

The configurations of the above-described preferred embodiment and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2013-052931 filed in the Japan Patent Office on Mar. 15, 2013; the entire disclosure of which is incorporated herein by reference.

REFERENCE SIGNS LIST

1 Substrate processing apparatus
9 Substrate
21 Substrate holding part
22 Cup part
31 Ejection head
35 Supply part movement mechanism
43 Lid part
44 Reservoir
47 Liquid removing part
49 Immersion liquid
311 Ejection surface
312 Head body part
314 Outlet
315 Piezoelectric element
431 First opening
S11 to S17 Step

What is claimed:

1. A standby method for an ejection head, said standby method being a method of placing said ejection head of a substrate processing apparatus on standby, said ejection head being disposed inside a cup part and above a substrate holding part surrounded by said cup part and being configured to eject a processing liquid from an outlet provided in an ejection surface toward a substrate held by said substrate holding part,
said standby method comprising:
a) moving said ejection head from a position inside said cup part to a position outside said cup part;
b) causing relative movement of said ejection head and a reservoir in which an immersion liquid is retained, in a direction that said ejection head and said reservoir become closer to each other, and causing said ejection surface of said ejection head to be immersed in said immersion liquid;
c) separating said ejection surface from said immersion liquid either by discharging said immersion liquid from said reservoir or by causing relative movement of said ejection head and said reservoir in a direction that said ejection head and said reservoir become away from each other;
d) removing said immersion liquid that remains on said ejection surface; and
e) moving said ejection head to a position inside said cup part, wherein
said ejection head includes:
a head body part having an outer surface, part of which is said ejection surface, and for holding said processing liquid therein; and
a piezoelectric element attached to said head body part and for vibrating said processing liquid held in said head body part to cause the ejection of said processing liquid from said outlet, and said operation b) includes driving said piezoelectric element to vibrate said immersion liquid retained in said reservoir in a state where said ejection surface is immersed in said immersion liquid in said operation b),
the standby method further comprises, after said operation b) and before said operation c), f) continuously or intermittently ejecting from said outlet into the immersion liquid, said processing liquid supplied from a processing liquid supply source to said ejection head, in a state where said ejection surface is immersed in said immersion liquid, and
the ejection of said processing liquid from said outlet is stopped before said operation c).

2. The standby method for the ejection head according to claim 1, wherein
said immersion liquid that remains on said ejection surface is removed by emitting gas toward said ejection head in a direction away from said substrate holding part in said operation d).

3. The standby method for the ejection head according to claim 1, wherein
said immersion liquid is continuously or intermittently supplied and discharged into and from said reservoir in a state where said ejection surface is immersed in said immersion liquid between said operation b) and said operation c).

4. The standby method for the ejection head according to claim 3, wherein
said immersion liquid is supplied from a bottom of said reservoir and discharged from a top of said reservoir.

5. The standby method for the ejection head according to claim 1, wherein
said immersion liquid is the same type of liquid as said processing liquid.

6. The standby method for the ejection head according to claim 1, wherein
said ejection surface is formed of a lyophilic material having a high affinity for said immersion liquid.

7. The standby method for the ejection head according to claim 1, wherein
said substrate is cleaned with said processing liquid ejected from said ejection head toward said substrate.

8. A standby method for an ejection head, said standby method being a method of placing said ejection head of a substrate processing apparatus on standby, said ejection head being disposed inside a cup part and above a substrate holding part surrounded by said cup part and being configured to eject a processing liquid from a plurality of outlets provided in an ejection surface toward a substrate held by said substrate holding part,
said standby method comprising:
a) moving said ejection head from a position inside said cup part to a position outside said cup part;
b) causing relative movement of said ejection head and a reservoir in which an immersion liquid is retained, in a direction that said ejection head and said reservoir become closer to each other, and causing said ejection surface of said ejection head to be immersed in said immersion liquid;
c) separating said ejection surface from said immersion liquid by discharging said immersion liquid from said reservoir;
d) removing said immersion liquid that remains on said ejection surface by emitting gas toward said ejection head inside said reservoir after said operation c); and
e) moving said ejection head to a position inside said cup part, wherein said standby method further comprises, after said operation b) and before said operation c), f) continuously or intermittently ejecting said processing liquid from said plurality of outlets into the immersion liquid, in a state where said ejection surface is immersed in said immersion liquid, and the ejection of said processing liquid from said plurality of outlets is stopped before said operation c).

9. The standby method for the ejection head according to claim 8, wherein said reservoir is provided with a lid part for covering a top of said reservoir, said lid part having an insertion opening through which a lower end portion of said ejection head is inserted in said operation b).

10. The standby method for the ejection head according to claim 8, wherein said immersion liquid is continuously or intermittently supplied and discharged into and from said reservoir in a state where said ejection surface is immersed in said immersion liquid between said operation b) and said operation c).

11. The standby method for the ejection head according to claim 10, wherein said immersion liquid is supplied from a bottom of said reservoir and discharged from a top of said reservoir.

12. The standby method for the ejection head according to claim 8, wherein said immersion liquid is the same type of liquid as said processing liquid.

13. The standby method for the ejection head according to claim 8, wherein said ejection surface is formed of a lyophilic material having a high affinity for said immersion liquid.

14. The standby method for the ejection head according to claim 8, wherein said substrate is cleaned with said processing liquid ejected from said ejection head toward said substrate.

* * * * *